United States Patent [19]

Kurata

[11] 4,135,164

[45] Jan. 16, 1979

[54] SYNCHRONOUS GENERATING CIRCUIT DEVICES WITH TWO PHASE-LOCKED LOOPS AND FEEDBACK AROUND BOTH

[75] Inventor: Hirotaka Kurata, Tokyo, Japan

[73] Assignee: Sansui Electric Co., Ltd., Tokyo, Japan

[21] Appl. No.: 857,979

[22] Filed: Dec. 6, 1977

[30] Foreign Application Priority Data

Dec. 10, 1976 [JP] Japan .............................. 51/147840

[51] Int. Cl.² ............................................. H03B 3/04
[52] U.S. Cl. ...................................... 331/2; 325/329; 325/419; 329/122; 331/23; 331/25; 331/36 C
[58] Field of Search ............... 331/2, 18, 23, 25, 36 C; 329/122; 325/329–331, 418–423

[56] References Cited

U.S. PATENT DOCUMENTS 3,416,096  12/1968  Kim ................................ 331/36 C X
3,769,602  10/1973  Griswold ........................... 331/18 X Primary Examiner—Siegfried H. Grimm
Attorney, Agent, or Firm—Harris, Kern, Wallen & Tinsley

[57] ABSTRACT

A circuit device for generating a synchronous signal in synchronism with a steady wave component of an input signal and including a first phase-locked loop using the input signal as a reference signal, a second phase-locked loop using an output signal of a voltage controlled oscillator (VCO) of the first phase-locked loop as a reference signal, and a feedback circuit for feeding back and adding an output signal of a VCO of the second phase-locked loop to the input signal. The synchronous signal is stably obtained at the output of the VCO of the second phase-locked loop, even if the level of the steady wave component is relatively low. The level of the fed back signal may be controlled in response to the level of the steady wave component whereby the oscillation of the circuit device may be prevented.

11 Claims, 10 Drawing Figures

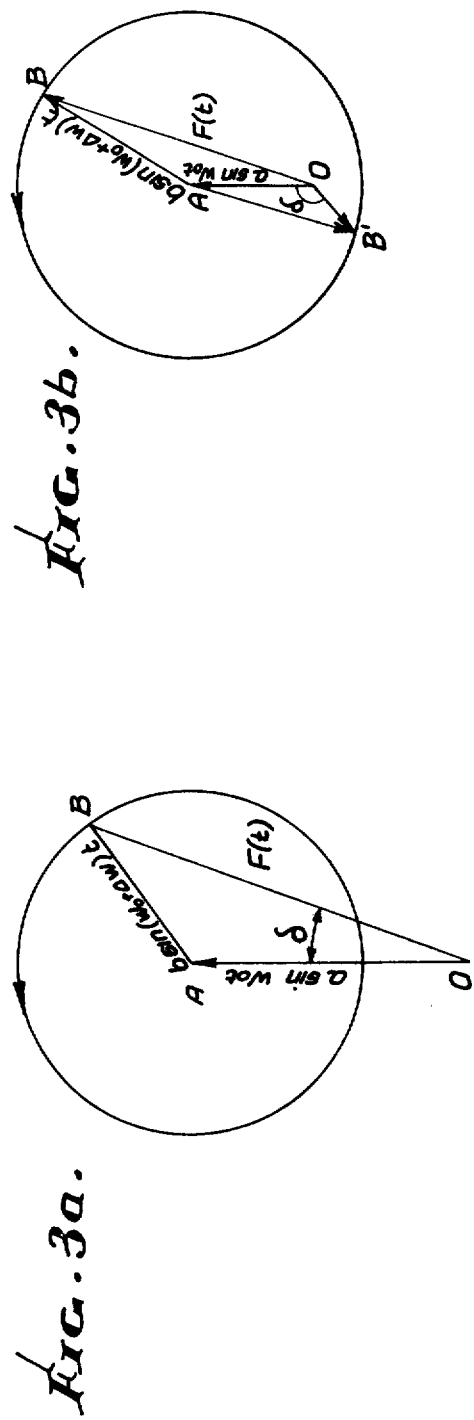
FIG. 3a.
FIG. 3b.
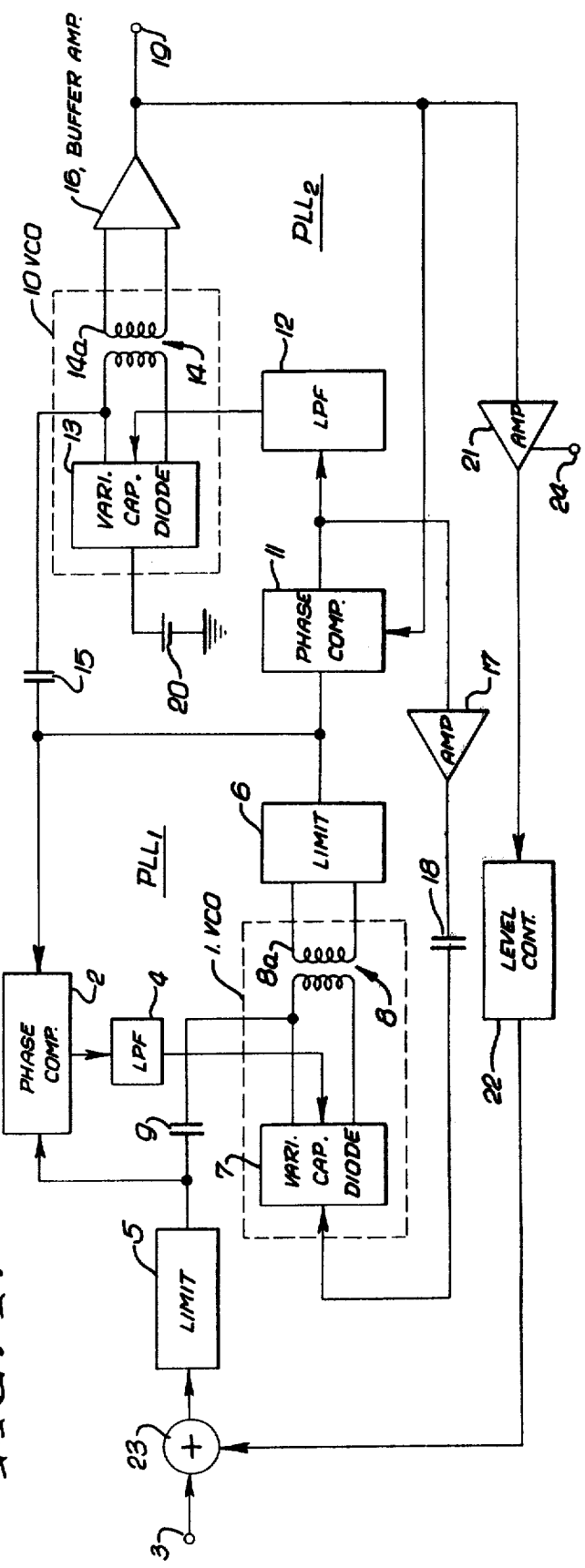
FIG. 4.

SYNCHRONOUS GENERATING CIRCUIT DEVICES WITH TWO PHASE-LOCKED LOOPS AND FEEDBACK AROUND BOTH

BACKGROUND OF THE INVENTION

This invention relates to a circuit device for generating a synchronous signal to a steady wave component of an input signal, and, in particular, to such a circuit device which is useful as a circuit for developing a carrier wave synchronous to a pilot signal in the reception of a carrier suppression broadcast wave.

In certain cases, for example, in the reception of a broadcast wave, a circuit is required which is for providing a synchronous signal to a steady wave component, for example, such as a carrier wave. The synchronous signal is used for the detection of the broadcast wave.

A known synchronous signal generating circuit device includes two phase-locked loops, one of which comprises a voltage controlled oscillator (VCO), a phase comparator for phase comparing the output of the VCO with the input signal such as the broadcast wave to control the output of the VCO. The other, or the second, phase-locked loop comprises a second VCO, a second phase comparator for phase comparing the output of the second VCO with the output of the first VCO to control the output of the second VCO.

The AC component of the output from the second phase comparator is fed back to the first VCO to control the first VCO so that the phase variation of the output of the first VCO due to the phase variation component in the input signal may be suppressed.

The synchronous signal is obtained as the output of the second VCO.

The known synchronous signal generating circuit device stably operates under the input signal having the steady wave component of a greater amplitude than that of a phase variation component. But if the amplitude of the phase variation component is greater than that of the steady wave component, the operation of the device is not stable.

For example, in a carrier suppression single side band broadcasting system, the amplitude of the pilot signal is smaller than that of the side band wave signal. Therefore, the known circuit device is not useful for obtaining a synchronous signal to the pilot signal in the single side band broadcast wave.

SUMMARY OF THE INVENTION

It is a general object of this invention to provide a circuit device for stably generating a synchronous signal to a steady wave component in an input signal having the steady wave component and at least one phase variation component, in no relation to the amplitude of the steady wave component in comparison with the phase variation component.

It is a specific object of this invention to provide a circuit device for generating a synchronous signal to a pilot signal in a carrier suppression signal to enable the detection of the carrier suppression signal.

It is another object of this invention to realize above objects with a simple and economical circuit formation.

A circuit device for generating a synchronous signal to a steady wave component of a signal having the steady wave component and at least one phase variation component according to this invention comprises first and second phase-locked loops. The signal is applied to an input terminal of the first phase-locked loop.

The first phase-locked loop comprises first VCO means, first phase comparator means for phase comparing the input signal with the output of the first VCO means, and first low-pass-filter means for obtaining a DC component signal from the output of the first phase comparator means and applying the DC signal as a control signal to the first VCO means.

The second phase-locked loop comprises second VCO means, second phase comparator means for phase comparing the output of the second VCO means with the output of the first VCO means, and second low-pass-filter means for obtaining a DC component signal from the output of the second phase comparator means and applying the DC signal as a control signal to the second VCO means.

The circuit device further comprises first and second feedback loops. The first feedback loop is for feeding back an AC component of the output of the second phase comparator means to the first VCO means, to suppress the generation of the phase variation component due to the phase variation component in the input signal, that is, to suppress the generation of the AC component.

Thus, the synchronous signal is obtained from the second VCO means as the output thereof.

The second feedback loop is for feeding back the output of the second VCO means to be added to the input signal. As a result, the synchronous signal is stably obtained even if the level of the steady wave component is smaller than that of the phase variation component.

The first VCO means may be, preferably, of a parallel resonance circuit which comprises a variable capacitance diode and an inductor, and to which the input signal is applied to be excited. The output is obtained from a secondary coil of the inductor. The second VCO means may be also a similar parallel resonance circuit to which the output of the first VCO means is applied.

The first phase comparator means is advantageously of a circuit for providing the output including a DC signal component in proportion to a value of cos $\theta$ ($\theta$ is a phase difference between the two signals to be compared.). As an example of such a circuit, a multiplier circuit may be preferably used.

The second phase comparator means may be also of a similar circuit.

Amplitude limiter means may be advantageously provided following the input terminal to amplitude limit the input signal, and also provided at the output of the first VCO means to amplitude limit the output from the first VCO means.

The second feedback loop may advantageously include a level control circuit to control the level of the signal to be fed back from the output of the second VCO means to a constant level which is smaller than that of the steady wave component of the input signal.

In the second feedback loop, variable gain amplifier means may be preferably provided for controlling the amplitude of the fed back signal to a reduced amplitude which is smaller than that of a reduced steady wave component of the input signal. The variable gain amplifier means is controlled by a control signal which is applied to a control terminal thereof.

If the circuit device is so arranged that the output of the second VCO means has a phase difference from the steady wave component of the input signal, phase shifter means is provided in the second feedback loop so that the in-phase signal is fed back and added to the input signal.

Further objects, features and aspects of this invention will be understood from following detailed descriptions of preferred embodiments of this invention in reference to the annexed drawings.

BRIEF DESCRIPTION OF THE DRAWINGS

FIG. 4 shows a schematic block diagram of an embodiment of this invention.

DETAILED DESCRIPTION OF PREFERRED EMBODIMENTS

Figure 1:
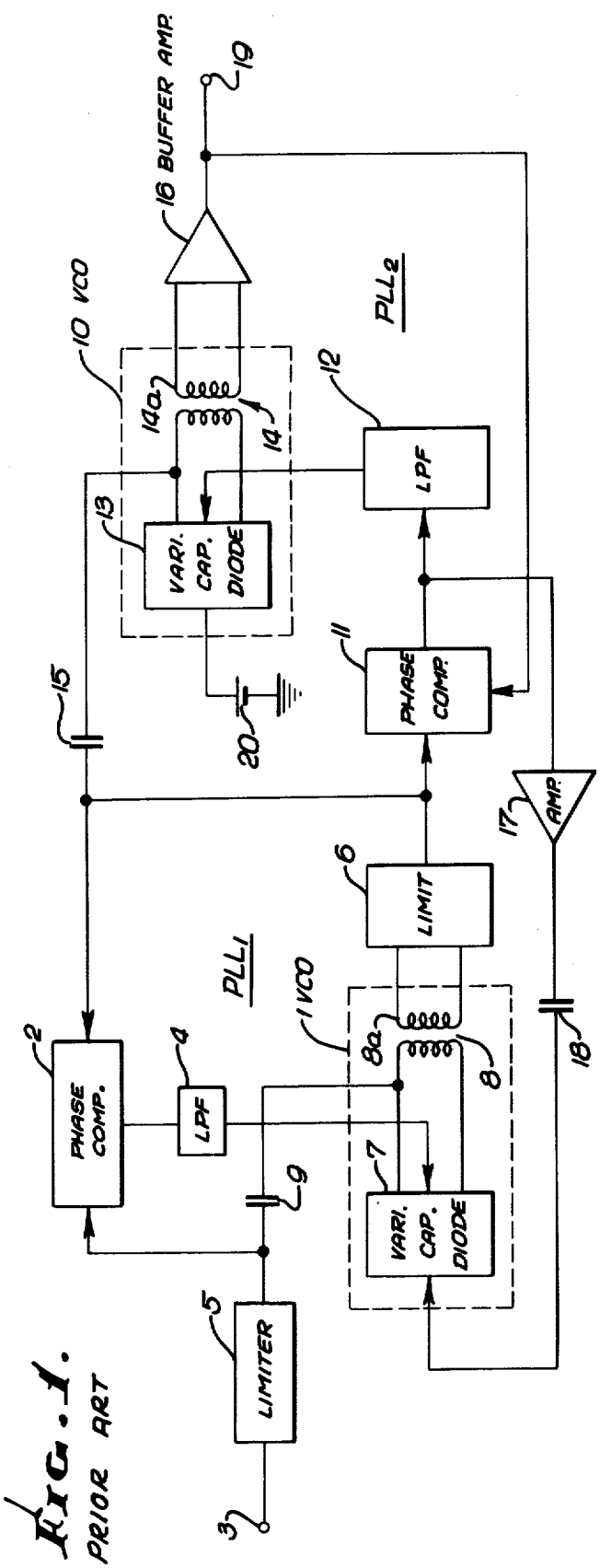
FIG. 1 shows a schematic block diagram of a known synchronous signal providing circuit, FIG. 2(a) graphically shows a variation of a DC component output to the phase difference of two signals to be phase compared at the first phase comparator in FIG. 1.

Referring to FIG. 1 showing a known synchronous signal generating circuit device, the shown circuit device comprises first and second phase-locked loops $PLL_1$ and $PLL_2$.

The first phase-locked loop $PLL_1$ comprises a first VCO 1, a first phase comparator 2 for phase comparing the output of the first VCO 1 and the input signal applied to an input terminal 3, and a first-low-pass-filter 4 for obtaining a DC component from the output of the phase comparator 2 as a control signal for the first VCO 1.

In order to remove amplitude variations of compared signals, an amplitude limiter 5 is connected to the input terminal, and another amplitude limiter 6 is connected at the output of the VCO 1, if necessary.

As the first VCO 1, in the shown embodiment, a parallel resonance circuit is used in the shown embodiment, which comprises a variable capacitance diode 7 and an inductor 8. The inductor 8 has a secondary coil 8a from which the output is obtained. To the resonance circuit, the input signal is applied through a capacitor 9.

Any known voltage controlled oscillator may be used in place of the parallel resonance circuit. The use of the parallel resonance circuit for a voltage controlled oscillating means has been known as described in, for example, "Radio Mentor Electron" 40 [11] 460–462 ('74) (see FIG. 4).

The second phase-locked loop $PLL_2$ comprises a second VCO 10, a second phase comparator 11 for phase comparing the output of the second VCO 10 with the output of the first VCO 1, and a second low-pass-filter 12 for deriving a DC component from the output of the second phase comparator 11. The derived signal is fed to the second VCO 10 as a control signal.

The second VCO 10 is also shown of a parallel resonance circuit of a variable capacitance diode 13 and an inductor 14. The output of the VCO 10 is obtained from a secondary coil 14a of the inductor 14. While, the output of the first VCO 1 is applied to the parallel resonance circuit through a capacitor 15 to excite it.

A buffer amplifier 16 is preferably provided at the output of the second VCO 10.

An AC component of the output of the second phase comparator 11 is fed back to the first VCO 1 through a feedback loop which comprises an AC amplifier 17 and a capacitor 18 to control the output of the first VCO 1, so that the phase variation component of the output of the first VCO 1 may be suppressed.

Thus, a signal synchronous to the steady wave component of the input signal is obtained from an output terminal 19 connected to the output of the buffer amplifier 16.

In FIG. 1, the reference numeral 20 represents a DC power source for biasing the variable capacitance diode 13.

The DC component of each of the phase comparators 2 and 11 varies independent of the phase difference $\theta$ between the two input signals thereto. Assuming that at a time when the phase difference $\theta$ is a predetermined value $\theta_0$, the level of the DC component is zero, if one of the two input signals leads the other by an angle $\alpha$ from the predetermined phase difference $\theta_0$, the level of the DC component is positive and varies independent of the angle $\alpha$. On the other hand, if the other leads the one input signal by an angle $\alpha$ from the phase difference $\theta_0$, the level of the DC component is negative and varies dependently on the angle $\alpha$.

Therefore, by the control of the VCO by the DC component from the phase comparator, the output of the VCO is stabilized to have the predetermined phase difference $\theta_0$ from the other input signal to the phase comparator.

But it should be noted that the stable control of the VCO by the output of the phase comparator is performed at $2n\pi \leq \alpha \leq 2n\pi + \pi/2$ (n = 0, 1, 2, ...). But it is not performed at $2n\pi + \pi/2 < \alpha < 2n\pi + \pi$, because the variation of the level of the DC component is of the opposite direction independent of the variation of the angle $\alpha$, in comparison with the case $2n\pi < \alpha < 2n\pi + \pi/2$.

For example, using a multiplier circuit as each of the phase comparators 2 and 11, the level of the DC component of the phase comparator is zero when the phase difference $\theta$ is $2n\pi + \pi/2$ and $2n\pi - \pi/2$. The variation of the level of the DC component is as shown in FIG. 2(a), in response to the variation of the phase difference $\theta$.

Figure 2B:
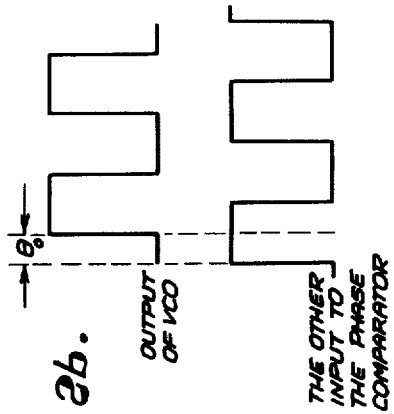
FIG. 2(b) shows waveforms of signals to be phase compared at the first phase comparator in FIG. 1, FIGS. 3(a) and 3(b) illustrate vector loci of different signals input to the circuit device in FIG. 1.
Figure 2A:
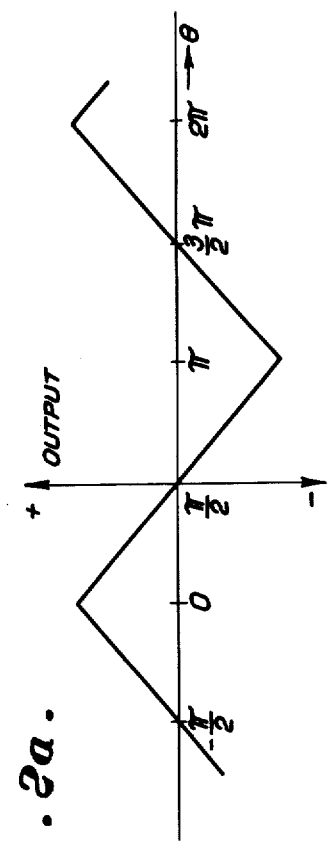

Assuming that the predetermined phase difference $\theta_0$ is selected $\pi/2$, which means that the output of the VCO is delayed by $\pi/2$ from the other input of the phase comparator as shown in FIG. 2(b), the variation of the level of the DC component due to the variation of $\theta$ is in the opposite direction at $(2n + 1)\pi < \theta < 2(n + 1)\pi$ or $2n\pi + \pi/2 < \alpha < 2n\pi + \pi$ in comparison with at $2n\pi < \theta < 2n\pi + \pi$ or $2n\pi < \alpha < 2n\pi + \pi/2$.

Referring to FIG. 1 again, the first phase-locked loop $PLL_1$ is so arranged that the output of the first VCO 1 is stabilized to lead the input signal by $\pi/2$ and the second phase-locked loop is so arranged that the output of the second VCO 10 is stabilized to delay by $\pi/2$ (or $\theta_0 = -\pi/2$) from the output of the first VCO 1. Thus, at the output of the second VCO 10, a signal is obtained which is in phase with the input signal at the input terminal 3.

It will be understood that a signal is also stably obtained at the output of the second VCO 10, which is phase-shifted by $\pi$ from the input signal by the designation of the two phase-locked loops $PLL_1$ and $PLL_2$.

The operation of the circuit device in FIG. 1 will be described, assuming that the input signal at the input terminal 3 is given by following equation (1);

$$F(t) = a \cdot \sin\omega_0 t + b \cdot \sin(\omega_0 + \Delta\omega)t \qquad (1)$$

where a and b represent amplitudes of respective components, and $\omega_0$ and $\omega_0 + \Delta\omega$ represent angular frequencies.

The vector locus of the equation (1) is as shown in FIG. 3(a), providing that $a > b$.

Referring to FIG. 3(a), the vector $\vec{AB}$ which represents the second component $b \cdot \sin(\omega_0 + \Delta\omega)t$ rotates counterclockwise around the end point A of the vector $\vec{OA}$ which represents the first component $a \cdot \sin\omega_0 t$, because $(\omega_0 + \Delta\omega) > \omega_0$. The point of O of the vector $\vec{OA}$ is outside of the circular locus of the end point B of the vector $\vec{AB}$ because $a > b$. Therefore, the deviation angle $\delta$ of the resultant vector $\vec{OB}$ which represents the signal F(t) from the vector $\vec{OA}$ is restricted between $-\pi/2$ and $\pi/2$.

If the first and second phase-locked loops $PLL_1$ and $PLL_2$ in FIG. 1 are so arranged that VCOs 1 and 10 are phase-locked to the signal of an angular frequency $\omega_0$ or $a \cdot \sin\omega_0 t$, the second component $b \cdot \sin(\omega_0 + \Delta\omega)t$ acts as a phase variation component.

But since the deviation angle $\delta$ from the vector $\vec{OA}$ due to the phase variation component is between $-\pi/2$ and $\pi/2$, both of VCOs 1 and 10 stably follow the variation and do not operate erroneously.

The variation which presents at the output of the second VCO 10 is fed back to the VCO 1 to suppress the variation, as described hereinbefore. Therefore, a signal is obtained at the output of the second VCO 10 which is synchronous to the steady wave component or $a \cdot \sin\omega_0 t$.

While, assuming $a < b$, the vector locus of the equation (1) is illustrated as shown in FIG. 3(b).

Referring to FIG. 3(b), the point O of the vector $\vec{OA}$ is inside of the circular locus of the vector $\vec{AB}$ because $a < b$. Accordingly it occurs that the deviation angle $\delta$ of the resultant vector $\vec{OB}$ from the vector $\vec{OA}$ has a larger value than $\pi/2$, for example, at a time when the vector $\vec{AB}$ is at an angular position as shown by $\vec{AB}$, in FIG. 3(b). At that time, neither of the VCO 1 and the VCO 10 is stably controlled, so that the circuit device in FIG. 1 does not stably operate.

This fault in the known circuit as shown in FIG. 1 is removed according to this invention.

Referring to FIG. 4, an embodiment of this invention is shown in the figure. The embodiment is similar as the known circuit device as shown in FIG. 1 and described hereinbefore, except that the output of the second VCO 10 is fed back to be added to the input signal. In FIG. 4, similar parts are represented by same reference characters as in FIG. 1, and the detailed description is omitted to the similar parts, for the simplification of the description.

In the shown embodiment, the output of the buffer amplifier 16 is fed back to the input side through an amplifier 21 and a level adjuster 22 for level controlling the amplitude of the fed back signal to a constant level. The fed back signal is added to the input signal at an adder 23 which is connected between the input terminal 3 and the amplitude limiter 5.

The fed back signal must be added to the input signal at the adder 23. Therefore, if the output of the buffer amplifier 16 has a phase difference from the steady wave component of the input signal, phase shifter means must be provided in the second feedback loop.

If the phase difference is designated $\pi$, a phase inverting amplifier may be used for the amplifier 21. Thus, no other phase shifter means is needed.

The description of the embodiment will be made to the case that the output of the buffer amplifier 16 is in-phase with the steady wave component of the input signal for the simplification of the description.

In the embodiment, assuming that the signal which is given by the equation (1) is applied to the input terminal 3, the signal $F_1(t)$ which is applied to the phase comparator 2 through the limiter 5 is expressed by following equation (2);

$$\begin{aligned}F_1(t) &= a \cdot \sin\omega_0 t + b \cdot \sin(\omega_0 + \Delta\omega)t + c \cdot \sin\omega_0 t \\ &= (a + c) \cdot \sin\omega_0 t + b \cdot \sin(\omega_0 + \Delta\omega)t\end{aligned} \qquad (2)$$

where $C \cdot \sin\omega_0 t$ is a signal which is fed back through the amplifier 21 and the level adjuster 22 and is added to the input signal at the adder 23.

Figure 5:
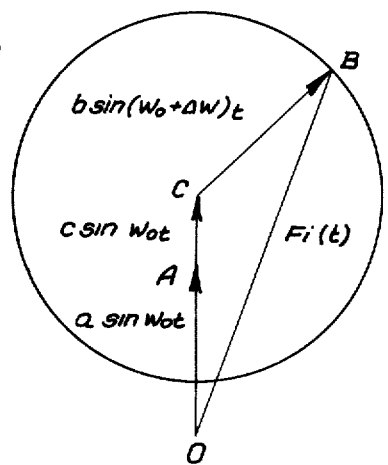
FIG. 5 shows a vector locus of an input signal added to the fed back signal in the embodiment in FIG. 4, FIGS. 6(a) and 6(b) show different circuit diagrams of the variable gain amplifier in FIG. 4.

The vector locus of the equation (2) is illustrated in FIG. 5, that is, the vector $\vec{CB}$ of the second component $b \cdot \sin(\omega_0 + \Delta\omega)t$ rotates counterclockwise around the end point C of the resultant vector $\vec{OC}$ of the vectors $\vec{OA}$ and $\vec{AC}$.

Therefore, if the amplitude c of the fed back signal is so selected that (a + c) is larger than b, the point O of the vector $\vec{OC}$ is outside of the circular locus of the vector $\vec{CB}$, even if $a < b$.

Accordingly, even if $a < b$, the deviation angle $\delta$ of the resultant vector $\vec{OB}$ which represents the signal $F_1(t)$ from the vector $\vec{OA}$ is between $-\pi/2$ and $\pi/2$.

Therefore, the phase-locked loops $PLL_1$ and $PLL_2$ stably operate, even if a phase variation component of a larger amplitude is included in the input signal. Thus, the synchronous signal is stably obtained in the embodiment.

In the embodiment as above described, when the amplitude a of the steady wave component of the input signal is considerably smaller than the amplitude c of the fed back signal, or $a << c$, the circuit device may oscillate. In order to prevent the oscillation, the fed back signal is required to be so controlled that the fed back amplitude c is smaller than the amplitude a of the steady wave component.

To this end, the amplifier 21 may be of a variable gain amplifier, whose gain is controlled by a control signal which is applied to a control terminal. The control terminal is shown by 24 in FIG. 4.

Figure 6A:
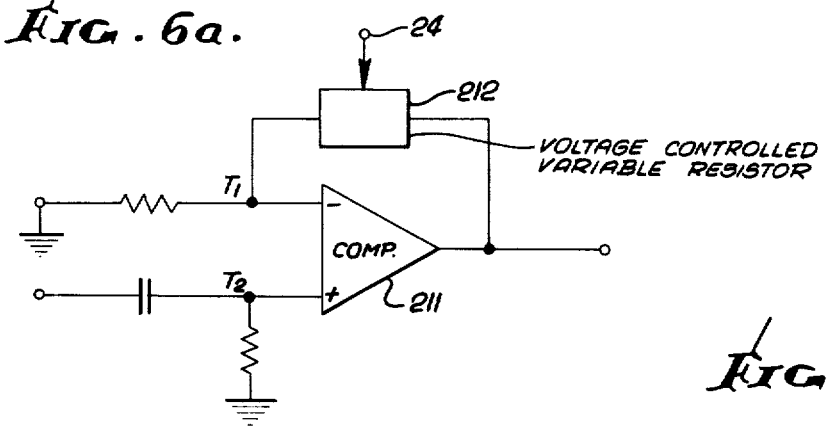
Figure 6B:
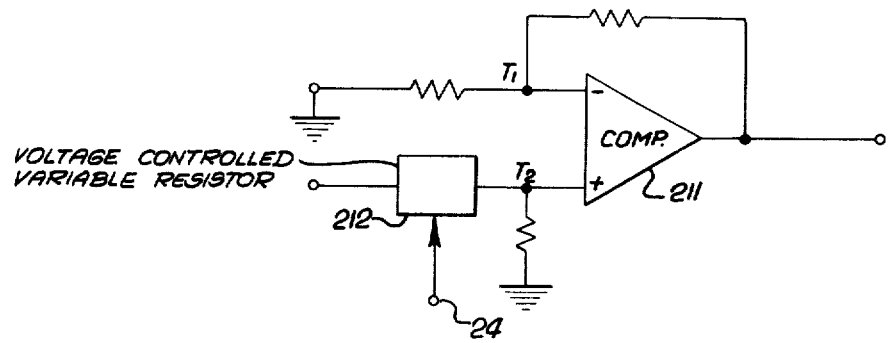

FIGS. 6(a) and 6(b) illustrate different examples of such a variable gain amplifier.

Referring to FIG. 6(a), the amplifier comprises a comparing amplifier 211, for example, such as a differential amplifier, a voltage controlled variable resistor 212, for example, such as a diode, which is connected between the output terminal and the negative (−) input terminal $T_1$ of the comparing amplifier.

The negative input terminal $T_1$ is connected to a reference voltage potential or the ground, and to the other, or a positive (+) terminal $T_2$, an input signal is applied, so that the in-phase signal is obtained from the output of the comparing amplifier.

The amplitude of the output is controlled by a control voltage signal applied to the voltage controlled variable resistor 212 through a terminal 24.

To obtain an output which is phase-shifted by $\pi$, the input signal is applied to the negative input terminal $T_1$ in place of the positive terminal $T_2$. Then, the positive input terminal $T_2$ is maintained at a reference voltage potential in place of the negative input terminal.

FIG. 6(b) illustrates another example, in which the voltage controlled variable resistor 212 is provided at the input circuit of the input signal. Between the output of the comparing amplifier and the negative input terminal $T_1$, a fixed resistor is connected. Since the level of the input signal is controlled by the control of the variable resistor 212, the level of the output is controlled by the application of control signal through the control terminal.

To perform a phase-inversion, the negative input terminal $T_1$ is used as a signal input terminal, and the positive input terminal $T_2$ is maintained at a reference potential.

It will be understood that the circuit device of this invention is useful for obtaining a carrier for a synchronous detection of a signal including a carrier wave and single side band waves, such as a broadcast wave as is given by the following equation (3);

$$F_{AM}(t) = a \cdot \sin\omega t + \Sigma b_n \cdot \sin\{(\omega + \Omega_n)t + \phi_n\} \quad (3)$$

where a is an amplitude of a carrier wave, $b_n$ being an amplitude of a single side band wave, $\Omega_n$ being an angular frequency of an AM modulating signal, $\phi_n$ being an initial phase of the modulating signal, and $\omega$ being an angular frequency of the carrier. It will be understood that the equation (3) expresses an AM output in a case n modulation signals are used.

For the simplification of the description, when it is assumed that the single side band wave is of only one signal component or that the carrier is modulated by only one modulation signal, the equation (3) is rewritten as follows;

$$F_{AM_1}(t) = a \cdot \sin\omega t + b_1 \cdot \sin\{(\omega + \Omega_1)t + \phi_1\} \quad (4)$$

In the equation (4), $\phi_1$ can be ignored because it is an initial phase angle of a modulating signal. Apparently, it is noted that the equation (4) is equivalent to the equation (1). Accordingly, in the reception of the broadcast wave represented by the equation (4), the circuit device of this invention can be used for obtaining the carrier wave from the received broadcast wave for the synchronous detection thereof.

The circuit device of this invention can provide a synchronous signal to the steady wave component $a \cdot \sin\omega t$, even if the amplitude a is smaller than the amplitude $b_1$ of the phase variation component $b_1 \cdot \sin\{(\omega + \Omega_1)t + \phi_1\}$, as above described. In the reception of a carrier suppressed single side band wave, the circuit device of this invention is effectively used for the generation of the carrier wave for the synchronous detection of the signal wave.

Furthermore, the circuit device of this invention can be used for obtaining the carrier wave for the synchronous detection of such a carrier suppressed signal wave which is composed of a pilot signal, upper side band signal components and lower side band signal components.

The reception of the broadcast wave which is given by following equation (5) is assumed, $$F_{AMS}(t) = a \cdot \sin\omega t + \Sigma b_n \cdot \sin\{(\omega + \Omega_n)t + \phi_n\} + \Sigma c_m \cdot \sin\{(\omega - \Omega_m)t + \phi_m\} \quad (5)$$

where $a \cdot \sin\omega t$ represents a pilot signal, $b_n$ being an amplitude of the upper side band wave, $\Omega_n$ being an angular frequency of a modulating signal for obtaining the upper side band wave, $\phi_n$ being an initial phase angle of the modulating signal, $c_m$ being an amplitude of the lower side band wave, $\Omega_m$ being an angular frequency of another modulating signal for obtaining the lower side band wave, and $\phi_m$ being an initial phase angle of the another modulating signal.

Figure 7:
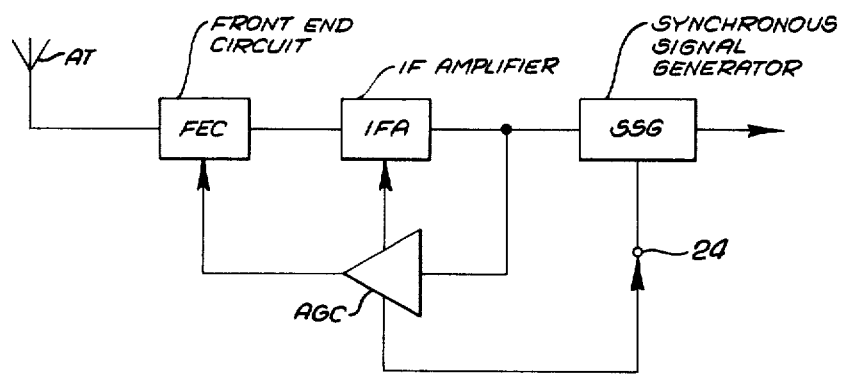
FIG. 7 shows a schematic block diagram of an example of an application of this invention.

As shown in FIG. 7, the signal received at an antenna AT is applied to the synchronous signal generator circuit SSG as shown in FIG. 4 through a front end circuit FEC and an IF amplifier IFA.

In the circuit SSG, the output of the circuit is fed back to the input of the circuit through the variable gain amplifier (21, in FIG. 4) and the level adjuster (22, in FIG. 4). The feedback factor is so controlled that the deviation angle of the vector of the resultant signal of the signal represented by the equation (5) and the fed back signal from the vector of the pilot signal is always between $-\pi/2$ and $\pi/2$. Thus, the synchronous signal to the pilot signal, or the carrier can be obtained at the output of the circuit SSG.

For the control of the feedback factor, the output of the known automatic gain control (AGC) amplifier AGC which is used for the control of the front end circuit FEC and the IF amplifier IFA may be employed and it is applied to the control terminal 24 of the variable gain amplifier (21, in FIG. 4).

This invention has been described in detail in connection with preferred embodiment, but it will be understood to those skilled in the art that the embodiments are for the exemplification and that further designations and various modifications are easily made within the scope of this invention.

What is claimed is:

1. A circuit device for generating a synchronous signal in synchronism with a steady wave component of a signal having the steady wave component and at least one phase variation component, comprising:

an input terminal to which the signal is applied;

a first phase-locked loop including a first voltage controlled oscillator (VCO) means, a first phase comparator means for phase comparing the input signal with an output of said first VCO means, and a first low-pass-filter for obtaining a control signal from an output of said first phase comparator means to control the output frequency of said first VCO means;

a second phase-locked loop including a second voltage controlled oscillator (VCO) means, a second phase comparator means for phase comparing the output of said first VCO means with an output of said second VCO means, and a second low-pass-filter for obtaining a control signal from an output of said second phase comparator means to control the output frequency of said second VCO means;

a first feedback means for feeding back an AC component of the output of said second phase comparator means to said first VCO means to suppress the generation of said AC component;

and a second feedback means for feeding back the output of said second VCO means to said input terminal to be added to the input signal, whereby said synchronous signal is obtained from the output of said second VCO means.

2. The synchronous signal generating circuit device as claimed in claim 1, wherein said first phase comparator means comprises first circuit means for providing the output including a DC signal component in proportion to a value of $\cos\theta_1$ ($\theta_1$ is a phase difference between the input signal and the output of said first VCO means), the DC signal component being applied to said first VCO means as the control signal through said first low-pass-filter.

3. The synchronous signal generating circuit device as claimed in claim 2, wherein said first circuit means is a multiplier circuit.

4. The synchronous signal generating circuit device as claimed in claim 1, wherein said first VCO means comprises a first parallel resonance circuit of a first variable capacitance diode and a first inductor having a primary coil and a secondary coil from which secondary coil the output is obtained, said first parallel resonance circuit being excited by the input signal, and said first variable capacitance diode being controlled by the control signal from said first low-pass-filter and the AC component fed back from said second phase comparator means.

5. The synchronous signal generating circuit device as claimed in claim 1, which further comprises first amplitude limiter means which is coupled to said input terminal to provide an amplitude limited signal of the input signal, and second amplitude limiter means which is coupled to the output of said first VCO means to amplitude limit the output of said first VCO means.

6. The synchronous signal generating circuit device as claimed in claim 1, wherein said second phase comparator means comprises second circuit means for providing the output including a DC signal component in proportion to a value of $\cos\theta_2$ ($\theta_2$ is a phase difference between the output of said first VCO means and the output of said second VCO means), the DC signal component being applied to said second VCO means as the control signal through said second low-pass-filter.

7. The synchronous signal generating circuit device as claimed in claim 6, wherein said second circuit means is a multiplier circuit.

8. The synchronous signal generating circuit device as claimed in claim 1, wherein said second VCO means comprises a second parallel resonance circuit of a second variable capacitance diode and a second inductor having a primary coil and a secondary coil from which secondary coil the output is obtained, said second parallel resonance circuit being excited by the output from said first VCO means, and said second variable capacitance diode being controlled by the control signal from said second low-pass-filter.

9. The synchronous signal generating circuit device as claimed in claim 1, wherein said second feedback means comprises amplifier means coupled to the output of said second VCO means for providing a fed back signal, and level adjuster means for level controlling the fed back signal to a predetermined level.

10. The synchronous signal generating circuit device as claimed in claim 9, wherein said amplifier means of said second feedback means is a variable gain amplifier means whose gain is controlled by an application of a control signal, whereby the amplitude of the fed back signal may be so controlled that an oscillation of the circuit device is prevented.

11. The synchronous signal generating circuit device as claimed in claim 10, wherein the output synchronous signal from said second VCO means has a phase difference of $\pi$ from the steady wave component in the input signal, said variable gain amplifier means being a phase-inverting variable gain amplifier whereby the fed back signal through said second feedback loop may be in-phase with the steady wave component.

* * * * *